US00RE45621E

(19) United States
(12) Reissued Patent
Ejima

(10) Patent Number: US RE45,621 E
(45) Date of Reissued Patent: Jul. 21, 2015

(54) ELECTRICAL JUNCTION BOX

(71) Applicant: SUMITOMO WIRING SYSTEMS, LTD., Yokkaichi, Mie (JP)

(72) Inventor: Takumi Ejima, Mie (JP)

(73) Assignee: SUMITOMO WIRING SYSTEMS, LTD., Mie (JP)

(21) Appl. No.: 14/330,608

(22) Filed: Jul. 14, 2014

Related U.S. Patent Documents

Reissue of:
(64) Patent No.: 8,383,963
Issued: Feb. 26, 2013
Appl. No.: 12/815,828
Filed: Jun. 15, 2010

(30) Foreign Application Priority Data

Jun. 30, 2009 (JP) ..... 2009-156376

(51) Int. Cl.
*H05K 7/02* (2006.01)

(52) U.S. Cl.
CPC ..... *H05K 7/02* (2013.01)

(58) Field of Classification Search
CPC ..... B60R 16/023; B60R 16/0238; B60R 16/0239
USPC ..... 174/541, 547; 439/76.2; 361/641
See application file for complete search history.

(56) References Cited

U.S. PATENT DOCUMENTS 4,963,099 A * 10/1990 Sato et al. ..... 439/76.2
6,774,309 B2 * 8/2004 Kasai ..... 174/66
7,120,024 B2 * 10/2006 Watanabe et al. ..... 361/704
7,160,118 B2 * 1/2007 Shirota ..... 439/76.2
7,172,437 B2 * 2/2007 Maebashi ..... 439/76.2

(Continued)

FOREIGN PATENT DOCUMENTS

CN 101316032 B 5/2012
JP A-9-102264 4/1997

(Continued)

*Primary Examiner* — Kenneth J Whittington
(74) *Attorney, Agent, or Firm* — Oliff PLC

(57) ABSTRACT

To provide an electrical junction box having a new structure that includes a plurality of electrical component mounting sections that are open in an upper surface, such that (1) the structure is provided with a drainage groove for preventing accumulation of water without requiring any special space, and (2) the structure can eliminate a problem of heat generation from electrical components. An electrical junction box includes a first and second electrical component mounting section units. A plurality of electrical component mounting sections are arranged in straight lines to from the first and second units, respectively. The first and second electrical component mounting segment units are separated apart from each other by a given distance and are arranged in parallel with each other. A heat radiation drainage groove is provided between opposed portions of peripheral walls that constitute the adjacent first and second units. The heat radiation drainage groove is provided in at least one end with an end opening that extends to ends of the first and second units and is open in an outer peripheral surface.

3 Claims, 3 Drawing Sheets

(56) References Cited

U.S. PATENT DOCUMENTS

| | | | | |
|---|---|---|---|---|
| 7,336,491 | B2 * | 2/2008 | Goemmel et al. | 361/707 |
| 7,514,629 | B2 * | 4/2009 | Sasaki et al. | 174/50 |
| 7,639,476 | B2 * | 12/2009 | Sasaki et al. | 361/641 |
| 7,671,275 | B2 * | 3/2010 | Kubota | 174/50 |
| 7,950,930 | B2 * | 5/2011 | Yoshida et al. | 439/76.2 |
| 8,027,168 | B2 * | 9/2011 | Senk et al. | 361/755 |
| 2006/0084294 | A1 * | 4/2006 | Kita | 439/76.2 |
| 2006/0216968 | A1 * | 9/2006 | Maebashi | 439/76.2 |
| 2008/0299800 | A1 * | 12/2008 | Yoshida et al. | 439/76.2 |

FOREIGN PATENT DOCUMENTS

| | | |
|---|---|---|
| JP | A-2002-058128 | 2/2002 |
| JP | A-2002-078150 | 3/2002 |
| JP | A-2002-152943 | 5/2002 |
| JP | A-2003-348733 | 12/2003 |
| JP | A-2003348733 | 12/2003 |
| JP | A-2009-131088 | 6/2009 |
| WO | WO 2006/109804 A1 | 10/2006 |

* cited by examiner

Fig. 1
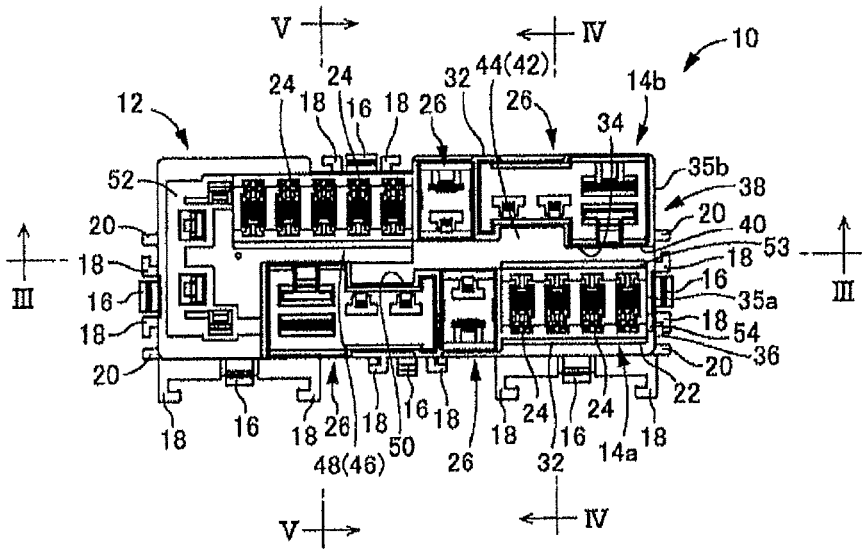
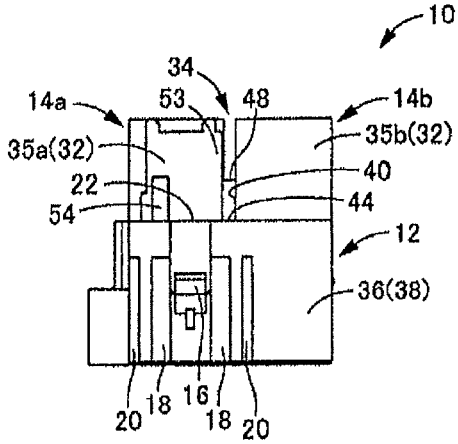
Fig. 2

Fig 3
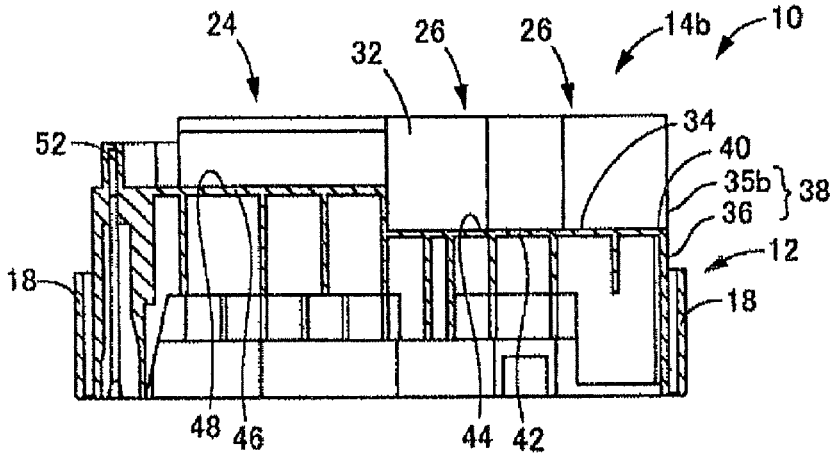
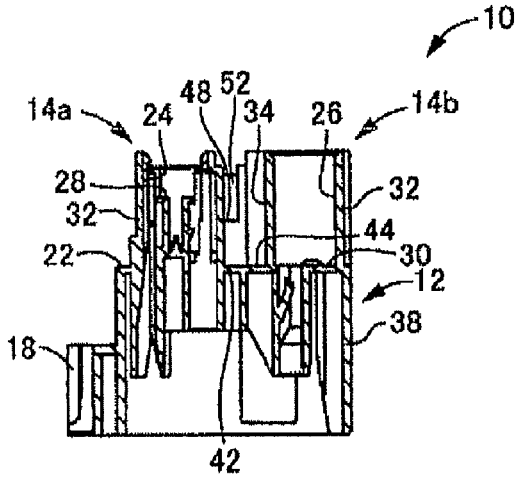
Fig 4

Fig. 5
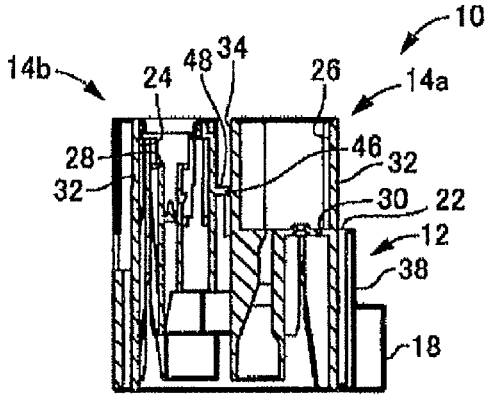
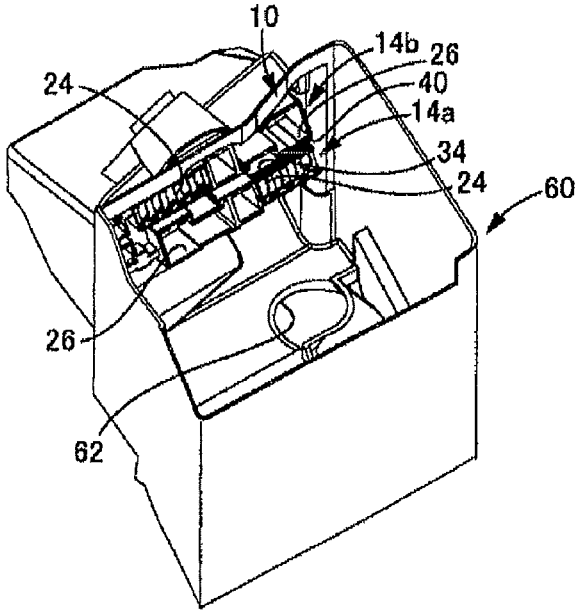
Fig. 6

ELECTRICAL JUNCTION BOX

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

This application claims priority to Japanese Patent Application 2009-156376 filed in Japan on Jun. 30, 2009, the entire disclosure of which is hereby incorporated by reference.

The exemplary embodiments relate to an electrical junction box to be mounted on a motor vehicle or the like and more particularly relates to an electrical junction box provided with a plurality of electrical component mounting sections that are open in a top surface.

Heretofore, an electrical junction box has been installed in an engine room or the like of a motor vehicle in order to enhance efficiency in electrical wiring. This electrical junction box mounts current-carrying components such as lead wires, bus bars, or current-carrying boards, and various kinds of electrical components such as relays, fuses, control devices, connectors for connecting external current-carrying circuits to internal current-carrying circuits, as required.

In the case where exchangeable electrical components such as relays and fuses are mounted on the electrical junction box, it is necessary to easily attach and detach only the electrical components to and from the electrical junction box installed in the motor vehicle. Accordingly, the electrical junction box is provided with electrical component mounting sections that are open in an upper surface of the box. For example, JP 2003-348733 A has disclosed such electrical junction box.

If the electrical component mounting sections are open in the upper surface of the electrical junction box installed in the engine room or the like, there is a possibility that water is accumulated on the upper surface of the electrical junction box and the water enters the box through openings in the sections. If the water contacts with internal electrical components, a problem of electrical leakage or short circuit may be caused.

JP 2002-152943 A has disclosed an electrical junction box in which a special water cut-off wall is provided around the electrical component mounting sections and a special drainage path is provided to extend outward. Republication WO 2006/109804 A has disclosed an electrical junction box in which a special drainage groove is provided in an upper surface of the box.

However, the above electrical junction boxes require an additional space for providing a drainage groove except a space for providing the electrical component mounting sections. This will cause a problem of upsizing the electrical junction box.

Particularly, in the case where the electrical junction box is provided on an upper surface with many electrical component mounting sections, it will be more difficult to obtain a space for providing the drainage groove and an additional problem of heat generation due to many electrical components will be caused.

SUMMARY

In view of the above problems, the exemplary embodiments provide an electrical junction box having a new structure with many electrical component mounting sections that are open in an upper surface, wherein (1) the structure has a drainage groove for preventing accumulation of water without requiring any special space, and (2) the structure can overcome a problem of heat generation from electrical components.

In the exemplary embodiments an electrical junction box may be provided with a plurality of electrical component mounting sections that are open in an upper surface of the box. The plural electrical component mounting sections are arranged on straight lines to form a plurality of electrical component mounting section units. The respective electrical component mounting section units are defined by corresponding peripheral walls. The plural electrical component mounting section units are separated apart from one another and are arranged in parallel with one another. A heat radiation drainage groove may be provided between opposed portions of adjacent peripheral walls of adjacent electrical component mounting section units. The heat radiation drainage groove may be provided with an end opening in which at least one end extends to end edges of the electrical component mounting section units and may be open in outer peripheral surfaces of the units.

According to the exemplary embodiments of the present invention, it is possible to align many electrical component mounting sections and to enhance efficiency in space. Since the heat radiation drainage groove may be provided by artfully utilizing a space between the opposed portions of the electrical component mounting section units, (1) it may be possible to provide the drainage groove without requiring a special space. Further, since the heat radiation drainage groove may be provided between the opposed portions of the electrical component mounting section units, a clearance may be defined between the electrical component mounting section units. Thus, a problem caused by arranging many electrical component mounting sections in a high efficiency state in space can be overcome. (2) It is possible to obtain an effective heat radiation effect. In result, it is possible to downsize and compact the electrical junction box.

In the exemplary embodiments, the electrical junction box may include a groove bottom surface of the heat radiation drainage groove that may be lowered at a side of the end opening. According to the exemplary embodiments, it is possible to flow the water in the heat radiation drainage groove to the side of the end opening, thereby more positively discharging the water from the end opening.

In the exemplary embodiments, the electrical junction box may include electrical component mounting sections that may be consolidated and arranged in each of the electrical component mounting section units in a longitudinal direction of each unit in accordance with a depth of a cavity in each electrical component mounting section. Projecting heights of the peripheral walls of the units protruding from bottom walls of the cavities may be set to be different in the longitudinal direction of the units. Heights of the groove bottom surfaces may be set to be different in accordance with a change of the projecting heights of the peripheral walls.

According to the exemplary embodiments, since the position of the groove bottom wall of the heat radiation drainage groove is changed in accordance with the projecting heights of the peripheral walls, it is possible to more effectively obtain a reinforcing effect of the peripheral walls by the groove bottom wall. Since the heights of the groove bottom surfaces are set to be different, it is possible to provide a stepped portion on the groove bottom surface. It is possible to lower a side of the end opening by artfully utilizing the stepped portion.

In the exemplary embodiments, the electrical junction box may include a heat radiation drainage groove that may be provided on a side wall surface having the end opening with a drainage guide that downward guides water discharged from the end opening.

According to the exemplary embodiments, it is possible to restrain spatters of the water discharged from the end opening, thereby obtaining more effective and efficient drainage effect. Since it is possible to set a drainage path, it is possible to more positively lead the water to, for example, a drainage hole in a cover to which the electrical junction box is attached.

According to the exemplary embodiments, since a plurality of the electrical component mounting sections may be arranged on straight lines to form a plurality of electrical component mounting section units and the heat radiation drainage groove may be provided between the opposed surfaces of the units, it is possible to provide the heat radiation drainage groove with high efficiency in space. At the same time, since the heat radiation drainage groove may be interposed between the electrical component mounting section units and the units may be separated apart from one another, it is possible to enhance a heat radiation effect, and to downsize and compact the electrical junction box.

BRIEF DESCRIPTION OF THE FIGURES

FIG. 1 is a top plan view of an embodiment of an electrical junction box in accordance with an exemplary embodiment.

FIG. 2 is a side elevation view of the electrical junction box shown in FIG. 1.

FIG. 3 is a longitudinal section view taken along lines III to III in FIG. 1.

FIG. 4 is a cross section view taken along lines IV to IV in FIG. 1.

FIG. 5 is a cross section view taken along lines V to V in FIG. 1.

FIG. 6 is a perspective view of the electrical junction box shown in FIG. 1, illustrating the box attached to a cover.

DETAILED DESCRIPTION OF EMBODIMENTS

Referring now to the drawings, exemplary embodiments of an electrical junction box will be described below.

Firstly, FIGS. 1-5 show an embodiment of a fuse box 10 that is an example of an electrical junction box in accordance with the exemplary embodiments. The fuse box 10 may be formed into a rectangular parallelepiped block made of synthetic resin. Specifically, the fuse box 10 may include a rectangular parallelepiped block-like main body 12, a first electrical component mounting section unit 14a, and a second electrical component mounting section unit 14b. The first and second units 14a and 14b protrude upward from the main body 12.

The main body 12 may be provided at suitable positions on an outer peripheral surface with a plurality of locking pawls 16. A guide rib 18 may be provided on opposite outsides of each locking pawl 16 to extend in an assembling direction (upper and lower directions in FIG. 2) of a cover 60 mentioned after. An anti-mismatch rib 20 may be provided on opposite outsides of each locking pawl 16 and each guide rib 18, as required. The anti-mismatch rib 20 may extend in parallel with the guide rib 18.

The main body 12 may be provided on an upper surface 22 with a pair of first and second electrical component mounting section units 14a and 14b. Since the first and second units 14a and 14b substantially have the similar structure, the first electrical component mounting section unit 14a is described hereinafter as a representative example.

The first electrical component mounting section unit 14a may include a plurality of fuse mounting sections 24 and a plurality of fusible link mounting sections 26 as electrical component mounting sections. Fuses and fusible links that constitute electrical components may be detachably mounted on the fuse mounting sections 24 and the fusible link mounting sections 26, respectively.

The fuse mounting sections 24 and fusible link mounting sections 26 are formed into cavity-like configurations that are open upward. Each fuse mounting section 24 may be smaller than each fusible link mounting section 26. As shown in FIGS. 4 and 5, a bottom wall 28 of each fuse mounting section 24 may be disposed above a bottom wall 30 of each fusible link mounting section 26. The bottom wall 30 of the fusible link mounting section 26 may be disposed on the same level as the upper surface 22 of the main body 12.

These fuse mounting sections 24 and fusible link mounting sections 26 may be arranged on straight lines to form the first and second electrical component mounting section units 14a and 14b. The numbers of the fuse mounting sections 24 and fusible link mounting sections 26 are not limited. In the exemplary embodiments, the first electrical component mounting section unit 14a may include four fuse mounting sections 24 and two fusible link mounting sections 26. The second electrical component mounting section unit 14b may include five fuse mounting sections 24 and two fusible link mounting sections 26. Either of the fuse mounting sections 24 and the fusible link mounting sections 26 may constitutes the first and second electrical component mounting section unit 14a and 14b.

The fuse mounting sections 24 and fusible link mounting sections 26 may be arranged in a longitudinal direction of the main body 12. Longitudinal directions of the first and second electrical component mounting section units 14a and 14b accord with the longitudinal direction of the main body 12. Further, the first and second electrical component mounting section units 14a and 14b may be separated apart from each other by a given distance and may be arranged in parallel with each other in a direction of the straight line defined by the fuse mounting sections 24 and fusible link mounting sections 26.

The fuse mounting sections 24 and fusible link mounting sections 26 may be arranged together in the longitudinal directions of the first and second electrical component mounting section units 14a and 14b. Further, the fuse mounting sections 24 and fusible link mounting sections 26 in the first and second electrical component mounting section units 14a and 14b may be arranged in symmetry with respect to a central point of the main body 12 in the longitudinal direction of the main body 12. Accordingly, the fuse mounting sections 24 and fusible link mounting sections 26 in the first and second electrical component mounting section units 14a and 14b may be substantially arranged in diagonal lines, respectively.

The first and second electrical component mounting section units 14a and 14b may be substantially surrounded through a whole periphery by peripheral walls 32 protruding upward from the main body 12. Protruding end edges of the peripheral walls 32 from the main body 12 may be set to be substantially the same heights in the first and second electrical component mounting section units 14a and 14b. Accordingly, a protruding dimension in height of the peripheral wall 32 from the bottom wall 28 of each fuse mounting section 24 that has a shallow cavity may be set to be smaller than a protruding dimension in height of the peripheral wall 32 from the bottom wall 30 of each fusible link mounting section 26 that has a deep cavity.

Since the first and second electrical component mounting section units 14a and 14b surrounded by the peripheral walls 32 are juxtaposed, a heat radiation drainage groove 34 may be defined between opposed portions of the peripheral walls 32 of the first and second electrical mounting section units 14a and 14b. The upper surface 22 of the main body 12 and outer surfaces of the peripheral walls 32 of the first and second electrical component mounting section units 14a and 14b define an inner surface of the heat radiation drainage groove 34 so that the heat radiation drainage groove 34 extends substantially on a central part of the main body 12 in the longitudinal direction.

A longitudinal end of each of the first and second electrical component mounting section units 14a and 14b accords with a longitudinal end of the main body 12. In the exemplary embodiments, a longitudinal end surface 35a at a side of the fuse mounting sections 24 in the first electrical component mounting section unit 14a, and a longitudinal end surface 35b at a side of the fusible link mounting sections 26 in the second electrical component mounting section unit 14b may be disposed on a longitudinal end of the main body 12. Particularly, the longitudinal end surface 35a of the first electrical component mounting section unit 14a is slightly shifted to an inside of the main body 12 from an outer peripheral wall 36 in the longitudinal direction of the main body 12. On the other hand, the longitudinal end surface 35b of the second electrical component mounting section unit 14b substantially accords with an outer peripheral surface 36 of the main body 12. Thus, the outer peripheral surface 36 of the main body 12 and the longitudinal end surfaces 35a and 35b of the first and second electrical component mounting section units 14a and 14b may constitute a side wall surface 38 of the fuse box 10. The heat radiation drainage groove 34 that extends to an end edge of the first and second electrical component mounting section units 14a and 14b may be provided in a longitudinal end with an end opening 40 that is open in the side wall surface 38. Accordingly, the heat radiation drainage groove 34 may be open upward through the whole length in the fuse box 10. The end opening 40 in the longitudinal direction of the groove 34 may be open in the side of the fuse box 10.

As shown in FIG. 4, at the side of the end opening 40 in the hear radiation drainage groove 34, the peripheral walls 32 of the first and second electrical component mounting section units 14a and 14b that define the groove inner surface may be connected to each other by a lower stage groove bottom wall 42 provided at the same level as the bottom wall 30 of the fusible link mounting sections 26. Thus, an upper surface of the lower stage groove bottom wall 42 defines a part of the upper surface 22 of the main body 12. A lower stage groove bottom surface 44 defines the groove bottom surface at the side of the end opening 40 in the heat radiation drainage groove 34.

On the other hand, as shown in FIG. 5, at the opposite side from the end opening 40 in the heat radiation drainage groove 34, the peripheral walls 32 of the first and second electrical component mounting section unit 14a and 14b that define the groove inner surface may be connected to each other by an upper stage groove bottom wall 46 provided at a position in height between the bottom wall 28 of each fuse mounting section 24 and the bottom wall 30 of each fusible link mounting section 26. The upper stage groove bottom wall 46 has a length through a whole length in an area provided with the fuse mounting sections 24 in the second electrical component mounting section 14b. Thus, the upper surface of the upper stage groove bottom wall 46 defines an upper stage groove bottom surface 48 as a groove bottom surface at the opposite side from the end opening 40 in the heat radiation drainage groove 34.

Accordingly, the heat radiation drainage groove 34 may be provided with the groove bottom surfaces having different stepped-like heights in the groove longitudinal direction. The lower stage groove bottom surface 44 at the side of the end opening 40 may be lower than the upper stage groove bottom surface 48 at the opposite side from the end opening 40. Particularly, in the peripheral wall 32 of the second electrical component mounting section unit 14b, the upper stage groove bottom wall 46 may be connected to a portion having a smaller protruding dimension in height of the peripheral wall 32 from the bottom wall 28 of the fuse mounting section 26 while the lower stage groove bottom wall 42 may be connected to a portion having a greater protruding dimension in height of the peripheral wall 32 from the bottom wall 30 of the fusible link mounting sections 26. Thus, since the upper and lower stage groove bottom walls 46 and 42 are interconnected to the peripheral walls 32 in accordance with a change in height of the peripheral wall 32, it is possible to effectively obtain a reinforcing effect for the peripheral wall 32 and to enhance strength of the peripheral wall 32, thereby providing the groove bottom surface of the heat radiation drainage groove 34 with a stepped portion and lowering the end opening at the side of the end opening 40 by artfully utilizing the stepped portion.

As shown in FIG. 1, the peripheral wall 32 of the first electrical component mounting section unit 14a may be provided at an opposite side from an end of the end opening 40 in the upper stage groove bottom wall 46 with a recess 50 that may be separated apart from the peripheral wall 32 of the second electrical component mounting section unit 14b. A width of the heat radiation drainage groove 34 is enlarged at the recess 50. On the other hand, the upper stage groove bottom wall 46 has a given dimension in width. Consequently, the peripheral wall 32 of the first electrical component mounting section unit 14a may be separated apart from the upper stage groove bottom wall 46 in the recess 50. The groove bottom surface of the heat radiation drainage groove 34 comprises the upper stage groove bottom surface 48 and the lower stage groove bottom surface 44 in the recess 50. Thus, the groove bottom surface of the heat radiation drainage groove 34 may have a stepped portion with different dimensions in height in a width direction (upper and lower directions in FIG. 1) at the connected portion between the upper groove bottom surface 48 and the lower stage groove bottom surface 44. This enhances efficiency in flow in the heat radiation drainage groove 34.

The upper surface 22 of the main body 12 at an opposite position from a side of the side wall surface 38 may protrude outward in the longitudinal direction of the first and second electrical component mounting section units 14a and 14b at the same level as the upper stage groove bottom wall 46. A U-shaped projection wall 52 protrudes upward from the upper surface 22 so that the wall 52 holds a bus bar (not shown), which serves as an inner circuit, from a lower position of the main body 12. The opposite ends of the projection walls 52 may be connected to the peripheral wall 32 at the opposite side from the side wall surface 38 in the first and second electrical component mounting section units 14a and 14b. Thus, the projection wall 52 may be provided at an opening opposite from the end opening 40 in the heat radiation drainage groove 34. The heat radiation drainage groove 34 may be open in the side of the fuse box 10 only at a side of the end opening 40.

Portions of the first and second electrical component mounting section units 14a and 14b at the opposite side from the end opening 40 may be interconnected to each other by the upper stage groove bottom wall 46 higher than the lower stage groove bottom wall 42. This prevents the fuse mounting sections 24 from being deflected. On the contrary, a portion of the first electrical component mounting section unit 14a at the side near the end opening 40 may be connected to the second electrical component mounting section unit 14b by the lower stage groove bottom wall 42 disposed at the same level as the bottom wall 30 of the fusible link mounting sections 26. Consequently, there is a possibility that the fuse mounting sections 24 are likely to be deflected. Accordingly, a portion of the first electrical component mounting section unit 14a near the fuse mounting sections 24 may be reinforced by a reinforcement wall 53 in which a thickness of the peripheral wall 32 increases toward the second electrical component mounting section unit 14b to restrain the fuse mounting sections 24 from being deflected.

The first electrical component mounting section unit 14a may be provided on a longitudinal end surface 35a with a guide projection 54 that extends straightly upward from the upper surface 22 to serve as a drainage guide. The guide projection 54 may protrude outward from the longitudinal end surface 35a in the longitudinal direction of the first electrical component mounting segment unit 14a so that the guide projection 54 does not extend over the outer peripheral surface 36 of the main body 12. An upward projecting dimension of the guide projection 54 may be set so that it does not reach an upper part of the longitudinal end surface 35a.

A bus bar or a terminal metal (not shown) is upwardly inserted into the main body 12 and is secured to the main body 12 by a locking mechanism. The bus bar or the terminal metal may be contained and fixed in the fuse mounting section 24 or the fusible link mounting section 26. The bus bar or the terminal metal may be electrically coupled to a fuse contained in the fuse mounting section 24 or a fusible link contained in the fusible link mounting section 26.

Further, for example, as shown in FIG. 6, the fuse box 10 may be fitted in a cover 60 and locked on the cover 60 by the locking pawls 16. When the cover 60 is secured to a vehicle body panel or the like, the fuse box 10 may be attached through the cover 60 to a motor vehicle.

As also shown in FIG. 6, the fuse box 10 may be attached to the cover 60 so that the fuse box 10 may be inclined with respect to the vertical direction. In this case, the fuse box 10 may be inclined so that the guide projection 54 may be disposed below the end opening 40 in the vertical direction. An inclination angle of the fuse box 10 with respect to the vertical direction may be set to be in a range of no 45° (0 degree to 45 degrees). If the inclination angle is more than 0° (0 degree), the guide projection 54 may be disposed below the end opening 40 in the vertical direction, thereby stably exerting a drainage guide function. If the inclination angle is less than 45° (45 degrees), it is possible to more stably obtain the drainage guide function from the guide projection 54 to an anti-mismatch prevention rib 20, as described after.

According to the fuse box 10 constructed above, plural fuse mounting sections 24 and plural fusible link mounting sections 26 are arranged on the straight lines to define the first and second electrical component mounting section units 14a and 14b. Since the units 14a and 14b are arranged in parallel with each other, it is possible to provide a number of fuse mounting sections 24 and fusible mounting sections with excellent efficiency in space.

Since the first and second electrical component mounting section units 14a and 14b may be separated apart from each other and may be disposed in parallel with each other, it is possible to very efficiently obtain a space for providing the heat radiation drainage groove 34 without upsizing the main body 12. Since the heat radiation drainage groove 34 does not extend outward from the main body 12, it is not necessary to provide a special space for the heat radiation drainage groove 34 at a side of the cover 60 to which the fuse box 10 is attached. This enhances flexibility in design for the cover 60 and general versatility for the fuse box 10.

Further, the heat radiation drainage groove 34 may be disposed between the first and second electrical component mounting section units 14a and 14b. This can exert a good heat radiation effect and can avoid a problem of heat radiation while arranging the plural fuse mounting sections 24 and plural fusible mounting sections 26 in small spaces. Particularly, in the exemplary embodiments, since the fuse mounting sections 24 and fusible link mounting sections 26 are arranged in the straight lines in the first and second electrical component mounting section units 14a and 14b, it is possible to exert a heat radiation effect from the opposite sides of the first and second electrical component mounting section units 14a and 14b, thereby obtaining a more excellent heat radiation effect.

Water adhered to the fuse box 10 can be discharged from the end opening 40 through the heat radiation drainage groove 34 to the outside. Further, since the groove bottom surfaces of the heat radiation drainage groove 34 are formed into the stepped-like configuration by the upper and lower stage groove bottom surfaces 48 and 44 so that a side of the end opening 40 is lowered, it is possible to effectively guide the water from a side of the end opening 40, thereby obtaining an excellent drainage effect. The water discharged from the fuse box 10 is discharged outward from the cover 60 through a wire harness drawing-out port 62 provided in the cover 60.

Since the guide projection 54 may be provided on the side wall surface 38, the water is discharged from the end opening 40 to the upper surface 22 of the main body 12, collides with the guide projection 54, and may be guided to a lower part of the fuse box 10. Thus, it is possible to obtain a more excellent drainage effect, to restrain water from spattering at random, and to reduce a problem that external electrical devices are immersed in water. Particularly, the fuse box 10 may be secured to the cover 60 in the inclined position and the anti-mismatch prevention rib 20 (the left end rib 20 in FIG. 2) may be disposed below the guide projection 54 in the vertical direction under the secured state. Thus, the water that collides with the guide projection 54 is guided by the anti-mismatch prevention rib 20, and may be discharged along the rib 20 outward from the fuse box 10. The anti-mismatch prevention rib 20 also serves as a duct.

The exemplary embodiments discussed herein are merely examples and the present invention is not limited to these embodiments. For example, electrical component mounting sections may be arranged on more than two arrays and may be surrounded by a peripheral wall to define a single electrical component mounting section unit. The number of electrical component mounting section units is not limited to two units in the above embodiment. More than three units may be provided. In the case of providing more than three units, these units may be arranged in parallel with one another and a heat radiation drainage groove may be provided among the adjacent units. Accordingly, more than two heat radiation drainage grooves may be provided.

The heat radiation drainage groove may be open in outer peripheral surfaces at the opposite sides of the electrical junction box. Further, a slope surface that gradually lowers downward to a side of the end opening may be adopted as the groove bottom surface of the heat radiation drainage groove. In the case of adopting the stepped-like configuration in the above embodiment, more than three stages may be selected.

An interior shape of the drainage guide can be set suitably to be a preferable guide direction in consideration of a shape of an electrical junction box, a position and a shape for attaching the electrical junction box. The drainage guide does not always extend straightly in the vertical direction of the electrical junction box, as is the case with the above embodiment. For example, the drainage guide may be inclined in a straight or curved line in the vertical direction of the electrical junction box, or may be formed into a recessed groove.

Although the above embodiment is directed to the fuse box for mounting fuses and fusible link, the electrical component mounting sections of the present invention may be sections for mounting relays, connectors, and the like.

What is claimed is:

1. An electrical junction box having an upper surface and a plurality of electrical component mounting sections provided on the upper surface, the electrical junction box comprising:

peripheral walls defining a plurality of electrical component mounting section units having end edges and outer peripheral surfaces, the plurality of electrical component mounting section units being: i) arranged in a straight line, ii) separated apart from one another, and iii) arranged in parallel with one another; and a heat radiation drainage groove provided between opposed portions of the peripheral walls, said heat radiation drainage groove: i) having an end opening that extends to the end edges of said plurality of electrical component mounting section units, and ii) being exposed by the outer peripheral surfaces of said plurality of electrical component mounting section units, wherein the heat radiation drainage groove includes a groove bottom surface that is lowest at a side of the end opening of the heat radiation drainage groove, the plurality of electrical component mounting sections each include a cavity with bottom walls, the plurality of electrical component mounting sections are consolidated and arranged in each of the plurality of electrical component mounting section units in a longitudinal direction of each unit in accordance with a depth of the cavity in each electrical component mounting section, the peripheral walls have projecting heights that protrude from the bottom walls of said cavities and the projecting heights are different in the longitudinal direction of the plurality of electrical component mounting section units, a height of *a portion of* the groove bottom surface is different *from a height of another portion of the groove bottom surface* based on a change of the projecting heights of the peripheral walls, a height of [a] *the portion of the* groove bottom surface connected with [a higher peripheral wall] *peripheral walls with higher projecting heights* is [higher] *lower* than a height of [other] *said another portion of the* groove bottom [surfaces] *surface* connected with [shorter] peripheral walls *with lower projecting heights*, and the groove bottom surface of the lowest height is provided at the side of the end opening.

2. The electrical junction box according to claim 1, further comprising:

a side wall surface having the end opening of the heat radiation drainage groove, the side wall surface of the electrical junction box being provided with a drainage guide that downwardly guides water discharged from the end opening.

[3. The electrical junction box according to claim 1, further comprising:

a side wall surface having the end opening of the heat radiation drainage groove, the side wall surface of the electrical junction box being provided with a drainage guide that downwardly guides water discharged from the end opening.]

[4. The electrical junction box according to claim 1, further comprising:

a side wall surface having the end opening of the heat radiation drainage groove, the side wall surface of the electrical junction box being provided with a drainage guide that downwardly guides water discharged from the end opening.]

*5. The electrical junction box according to claim 1, wherein the groove bottom surface is a stepped horizontal surface.*

* * * * *